United States Patent
McDougall et al.

(10) Patent No.: US 7,355,499 B2
(45) Date of Patent: Apr. 8, 2008

(54) MAGNET ASSEMBLY

(75) Inventors: Ian Leitch McDougall, Oxon (GB); Robert Andrew Slade, Oxon (GB); Peter Hanley, Gloucestershire (GB)

(73) Assignee: Oxford Instruments PLC, Oxon (GB)

( * ) Notice: Subject to any disclaimer, the term of this patent is extended or adjusted under 35 U.S.C. 154(b) by 148 days.

(21) Appl. No.: 10/528,194

(22) PCT Filed: Sep. 30, 2003

(86) PCT No.: PCT/GB03/04200

§ 371 (c)(1),
(2), (4) Date: Nov. 14, 2005

(87) PCT Pub. No.: WO2004/029644

PCT Pub. Date: Apr. 8, 2004

(65) Prior Publication Data
US 2006/0181383 A1 Aug. 17, 2006

(30) Foreign Application Priority Data
Sep. 30, 2002 (GB) ................................. 0222625.6

(51) Int. Cl.
*G01V 3/00* (2006.01)

(52) U.S. Cl. .................. 335/299; 335/301; 324/319
(58) Field of Classification Search ................ 335/216, 335/299, 301; 324/318–320; 600/410–422
See application file for complete search history.

(56) References Cited

U.S. PATENT DOCUMENTS 5,084,677 A * 1/1992 McDougall ................. 324/320
5,717,333 A * 2/1998 Frese et al. ................. 324/319

FOREIGN PATENT DOCUMENTS

| EP | 1 144 171 | 6/1985 |
| EP | 0 399 789 | 11/1990 |
| EP | 0 400 922 | 12/1990 |
| JP | 10-028682 | 2/1998 |
| WO | WO 98/43103 | 10/1998 |

* cited by examiner

Primary Examiner—Ramon M. Barrera

(57) ABSTRACT

A magnet assembly comprising first and second sets of coils (1, 2) for generating respective magnetic fields, wherein the coils are constructed and arranged such that under working conditions, a first homogeneous region (3) can be generated within the envelope defined by the magnet 10 assembly and a second homogeneous region (4) can be generated outside the envelope, the resultant magnetic field in each region being sufficiently homogeneous to enable a NMR process to be performed on an object in the region.

21 Claims, 12 Drawing Sheets

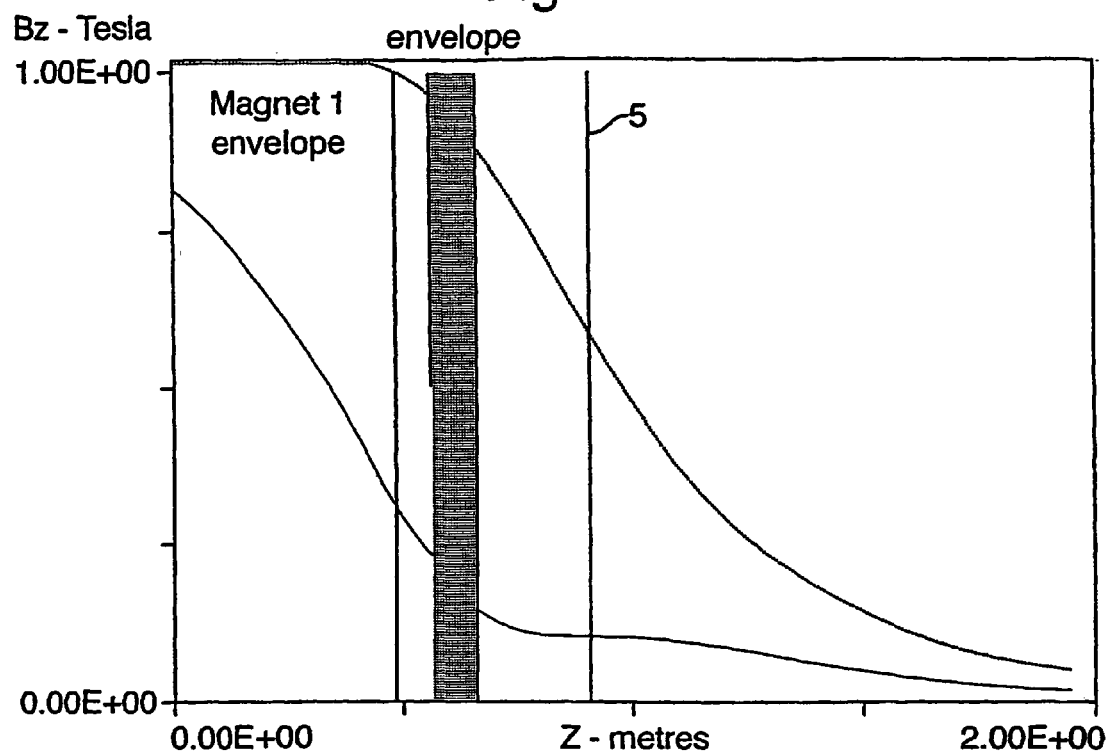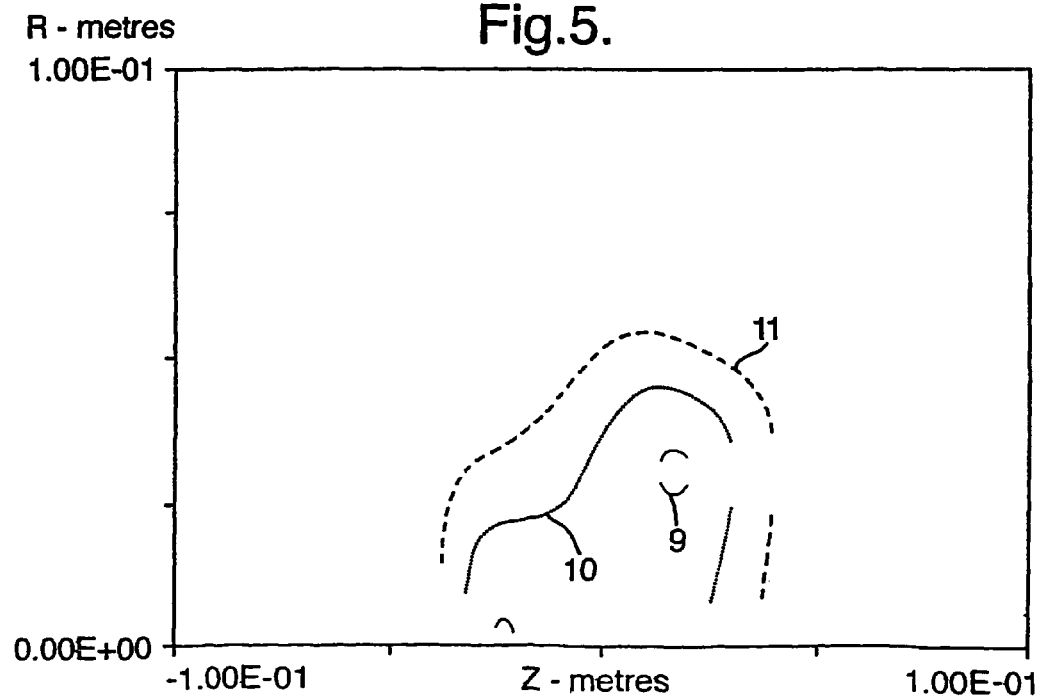

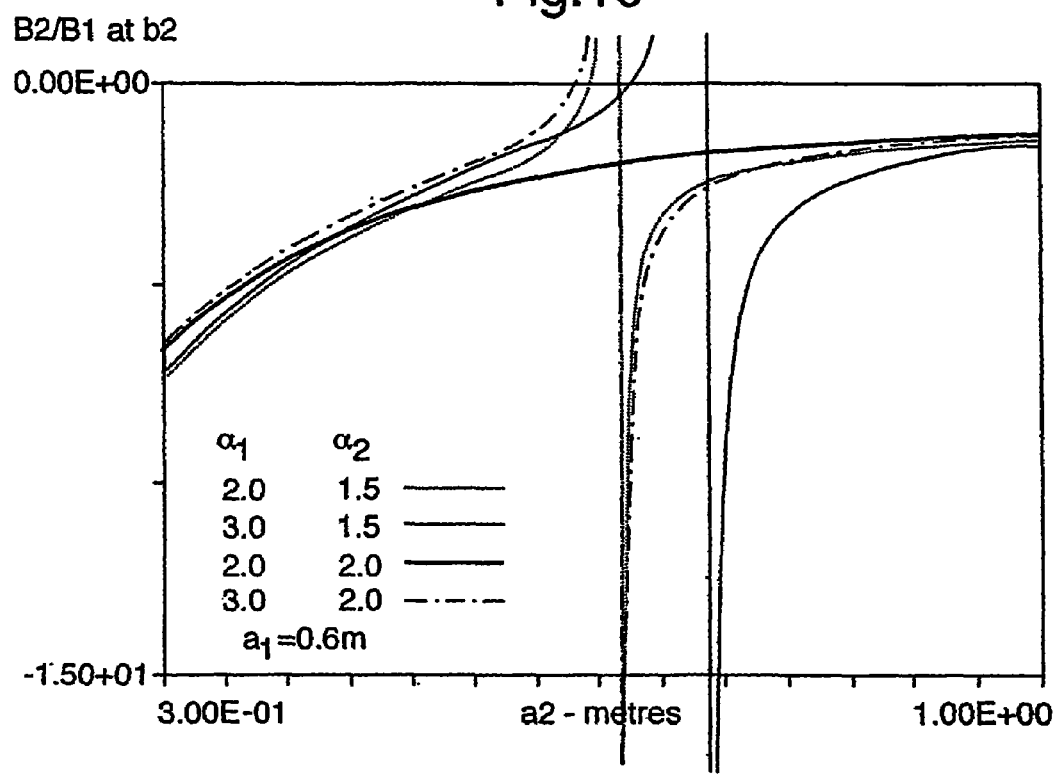
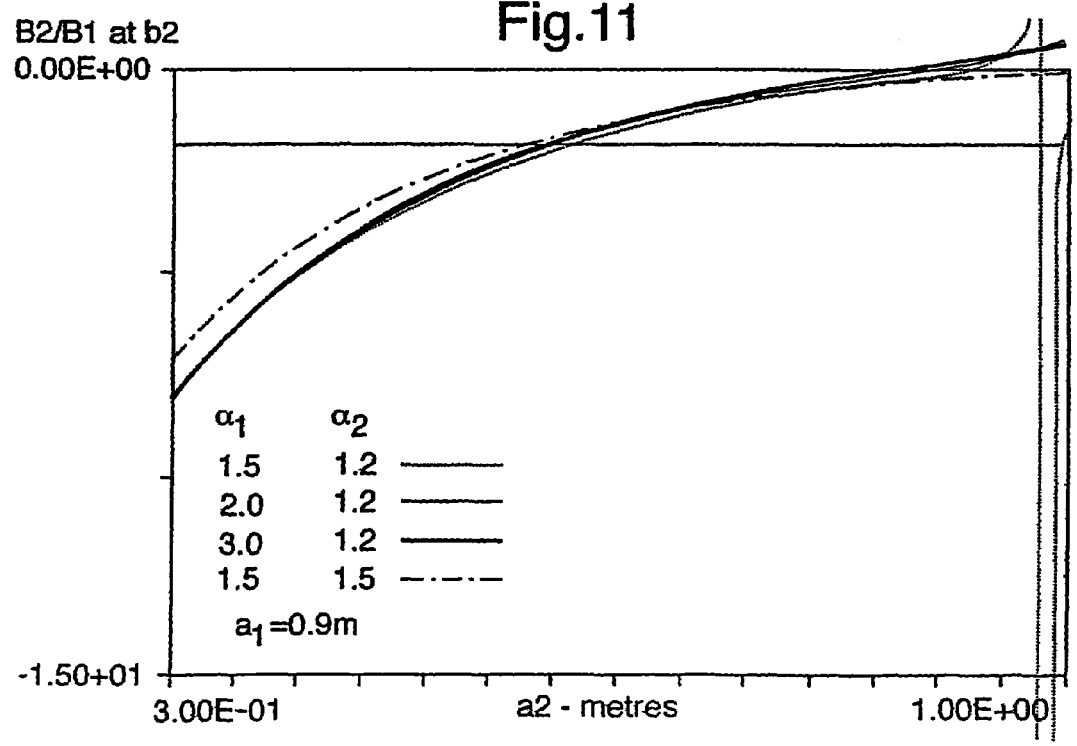

MAGNET ASSEMBLY

This application claims the benefit of PCT International Application Number PCT/GB03/04200 filed Sep. 30, 2003 and United Kingdom Application No. 0222625.6, filed Sep. 30, 2002, in Great Britain, the disclosures of which are incorporated herein by reference.

The invention relates to a magnet assembly for use in enabling a NMR (nuclear magnetic resonance) process to be performed on an object.

Conventional NMR requires the generation of a substantially uniform magnetic field in a working (or homogeneous) region. An object to be subject to the NMR process is located in the homogeneous region and is exposed to a RF pulse which causes an NMR signal to be issued in the usual manner from the object and this is then detected. Magnetic field gradients can be used to map the frequency and phase of the NMR signal to the location within the region from which the NMR signal is obtained.

NMR processes have found particular application in magnetic resonance imaging (MRI), particularly whole body imaging, but are also used in a wide variety of other applications including spectroscopy.

One problem with conventional NMR systems is that the homogeneous region is located fully within the magnet assembly itself and so for conventional human body MRI, a patient has to be located within the assembly. Various proposals have been made for open-access assemblies in which the homogeneous region is projected outside the magnet assembly. The problem with these new magnet assemblies is that in the field of MRI, users are very reluctant to replace their existing equipment by new, relatively untested equipment.

In accordance with the present invention, we provide a magnet assembly comprising first and second sets of coils for generating respective magnetic fields, wherein the coils are constructed and arranged such that under working conditions, a first homogeneous region can be generated within the envelope defined by the magnet assembly and a second homogeneous region can be generated outside the envelope, the resultant magnetic field in each region being sufficiently homogeneous to enable a NMR process to be performed on an object in the region.

With this invention, we have recognised that the magnet assemblies used for NMR processes generate a fringe magnetic field and that instead of trying to reduce this as is conventionally attempted, this can be utilized to create a second homogeneous region. Many magnet assemblies are actively shielded so as to reduce the fringe field but even with these it is still possible to generate an external homogeneous region, at least utilizing the axial fringe field. The advantage of this is that the user is presented with a familiar structure which continues to generate the conventional, first homogeneous region within the assembly but has the additional benefit of generating the second homogeneous region for open-access.

In some cases, the two homogeneous regions can be generated alternately which has the advantage that the first homogeneous region will be identical with its form if the second set of coils have not been provided (or actuated). Alternatively, the two homogeneous regions could be generated simultaneously which would simplify operation of the assembly although there would be a slight reduction in the size of the first homogeneous region compared with its size when the second set of coils was not operated (or present).

The first set of coils can take a conventional form and typically will define a solenoid and may be actively shielded.

The second set of coils are typically nested and preferably substantially co-planar to reduce the volume of their envelope. In general, at least two of the coils of the second set will carry working currents in opposite senses in order to generate the second homogeneous region.

Typically, the second set of coils will comprise at least two pairs of coils and in the preferred arrangement, in the first homogeneous region each pair of coils generates a substantially zero first order magnetic field gradient and substantially equal second order magnetic field gradients of opposite senses.

It may be possible in certain circumstances for one coil from each pair to be coalesced with the result that a total of three coils is needed.

It should also be recognised that although we have referred to separate coils in the above discussion, each set of coils could be connected in series.

The coils themselves are typically superconductive and preferably at least the second set of coils is made from high temperature superconductor. Alternatively, both sets of coils could be made of conventional low temperature superconductor and then housed within respective, or preferably the same, cryostats.

By defining the magnet assembly as having two sets of coils, it will be possible to form the second set of coils as a self-contained unit so that they can be separated from the first set of coils without compromising the operational integrity of the first set of coils. Thus, the second set of coils provides a "bolt-on" to a conventional magnetic resonance magnet assembly. In this connection, we mean that the second set of coils could be detached from the first set of coils without having to purge the cryostat containing the first set of coils.

In practice, however, it will usually be more efficient to construct the first and second sets of coils together, particularly if they are to be housed within the same cryostat.

Typically, the homogeneous regions will be substantially spherical but it would also be possible to construct the second set of coils such that the second homogeneous region is substantially disk shaped and has a magnetic field gradient in the axial direction. This enables slice selection to be more easily achieved without compromising the open access with obtrusive gradient coils.

In order to balance forces within the magnet assembly, preferably an additional set of second coils located adjacent an opposite side of the first set of coils to the one set of second coils.

Some examples of magnet assemblies according to the invention will now be described with reference to the accompanying drawings, in which:

FIGS. 4 and 5 are similar to FIGS. 2 and 3 respectively but for a self-shielded example;

Figure 13:
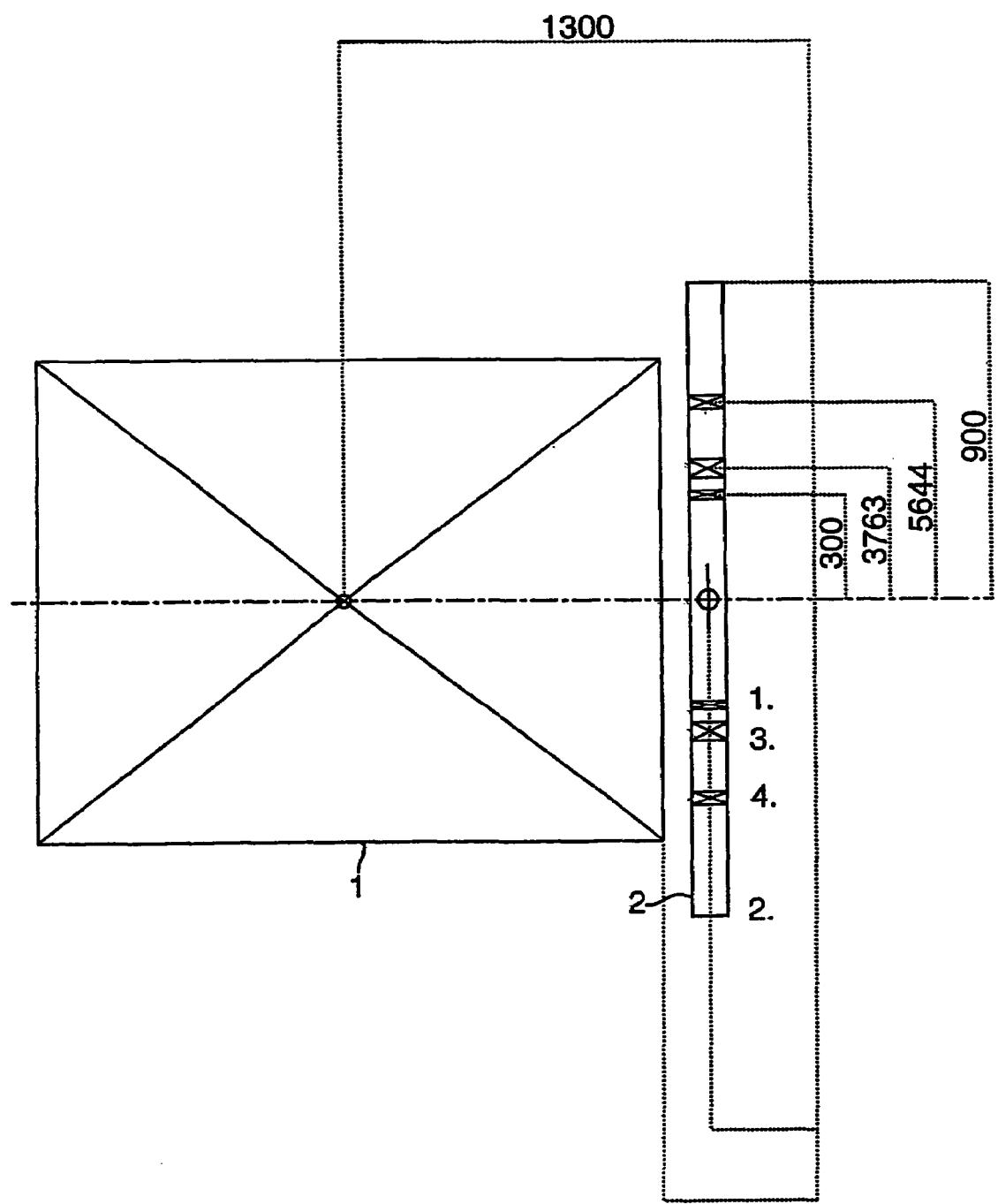
Figure 14:
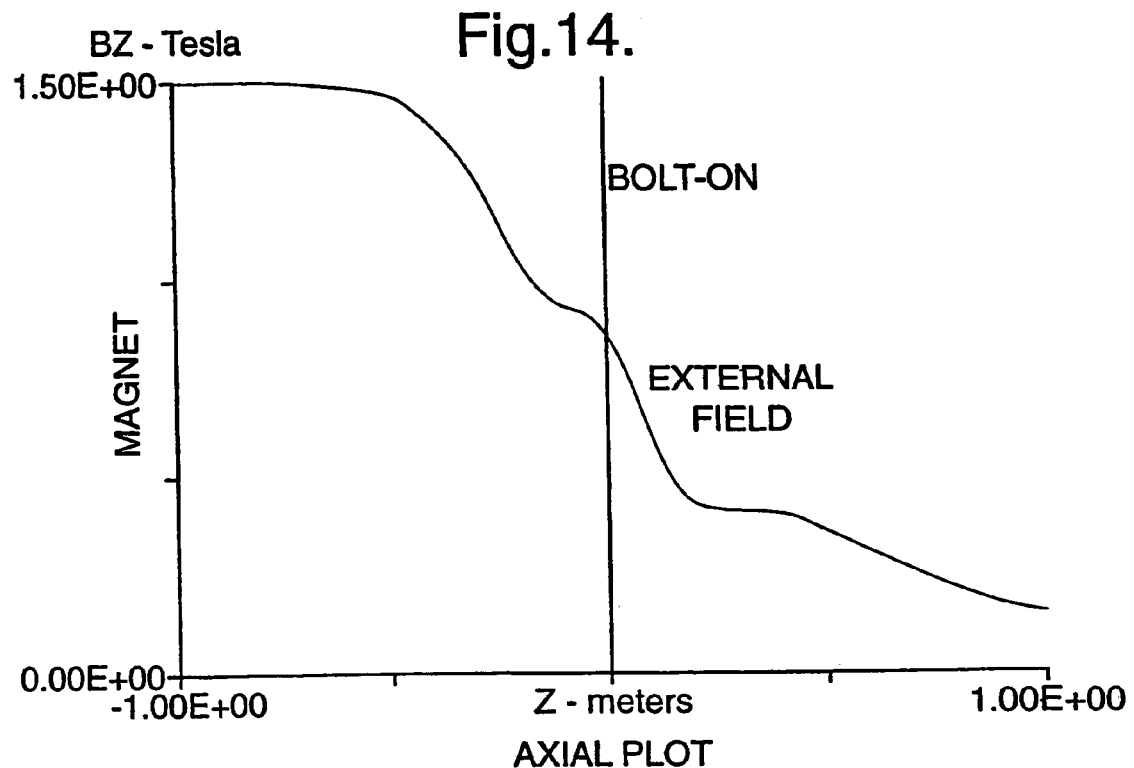
Figure 15:
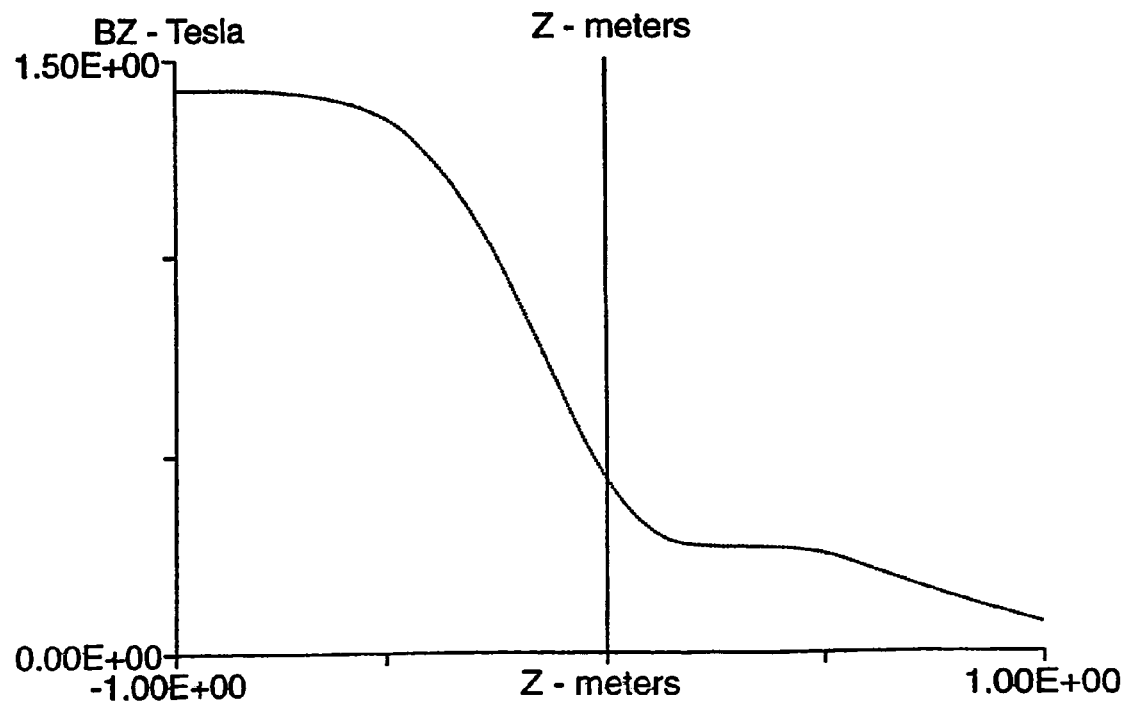
Figure 16:
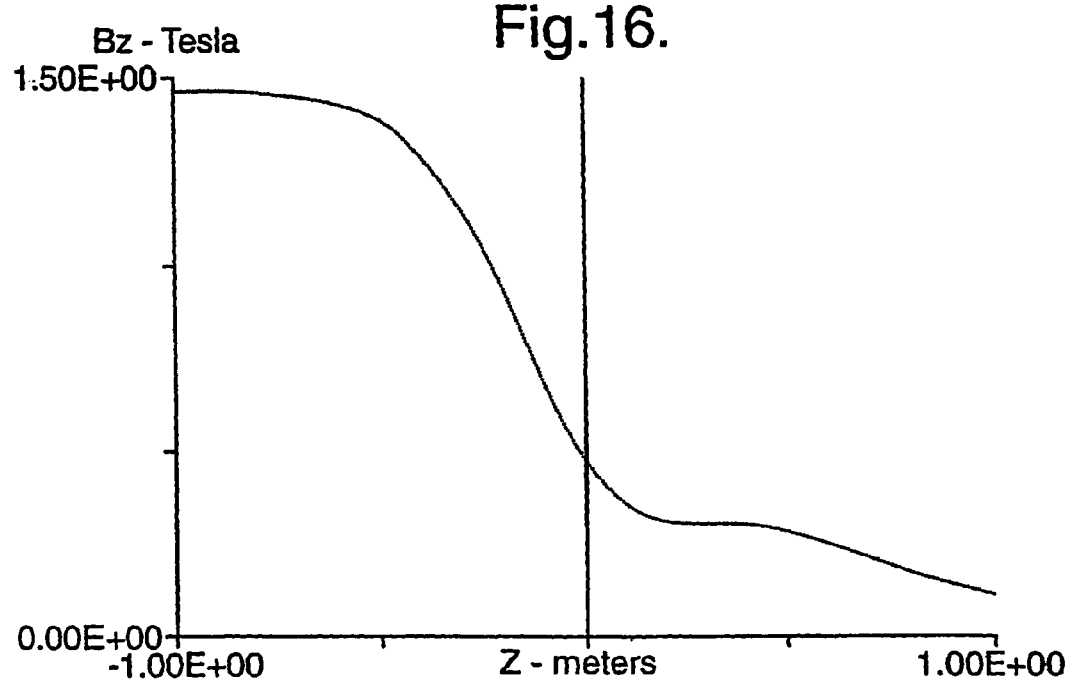
Figure 17:
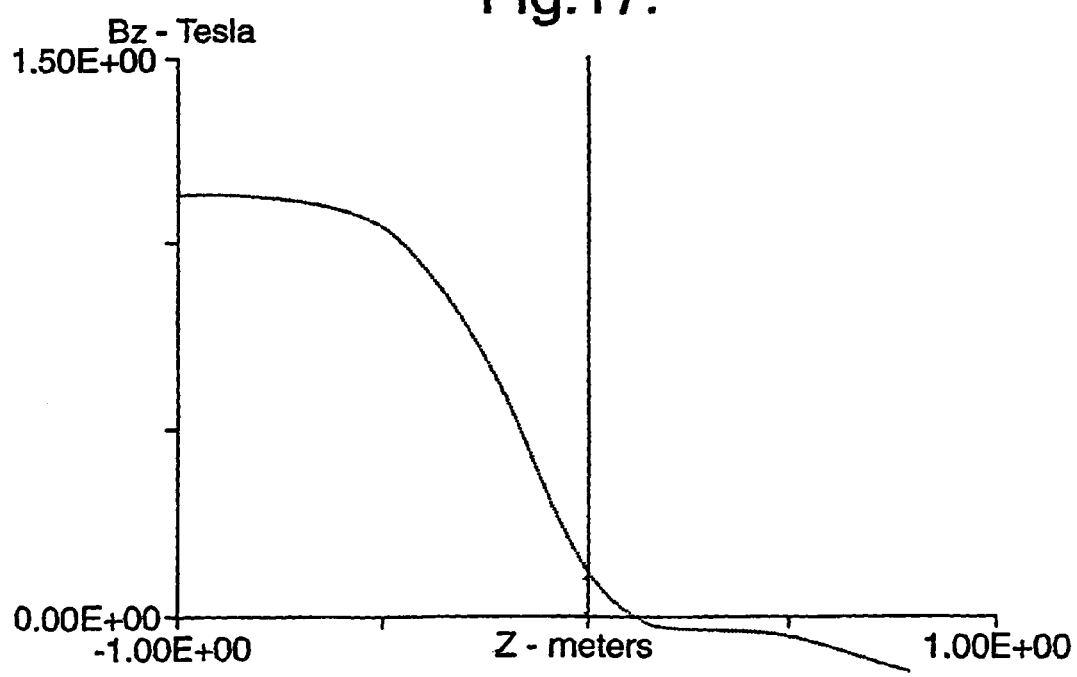
Figure 18:
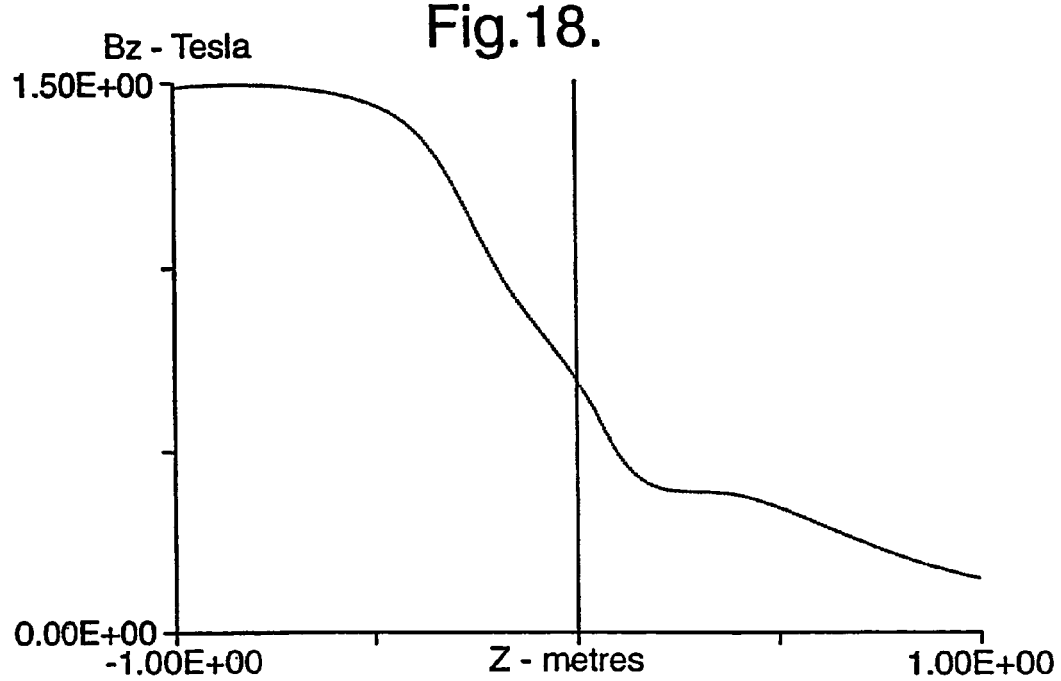
Figure 19:
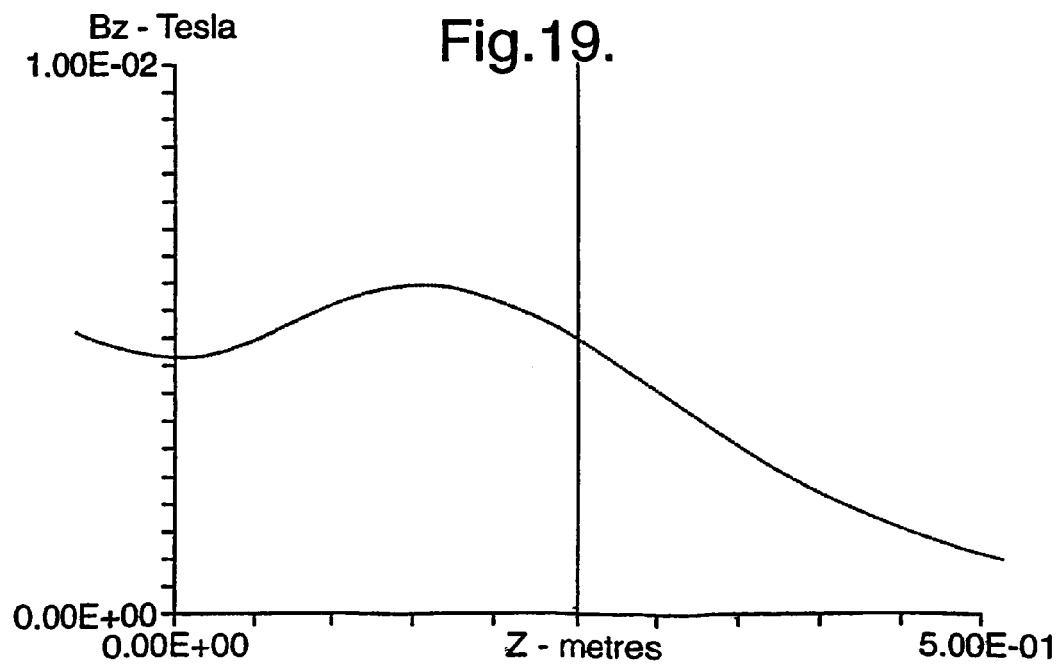
Figure 20A:
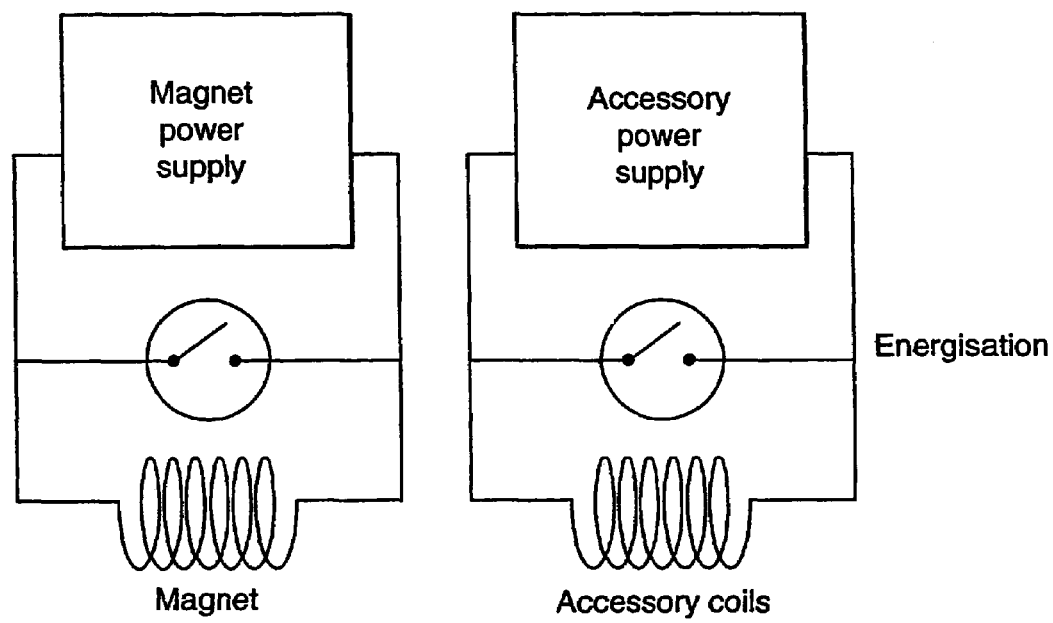
Figure 20B:
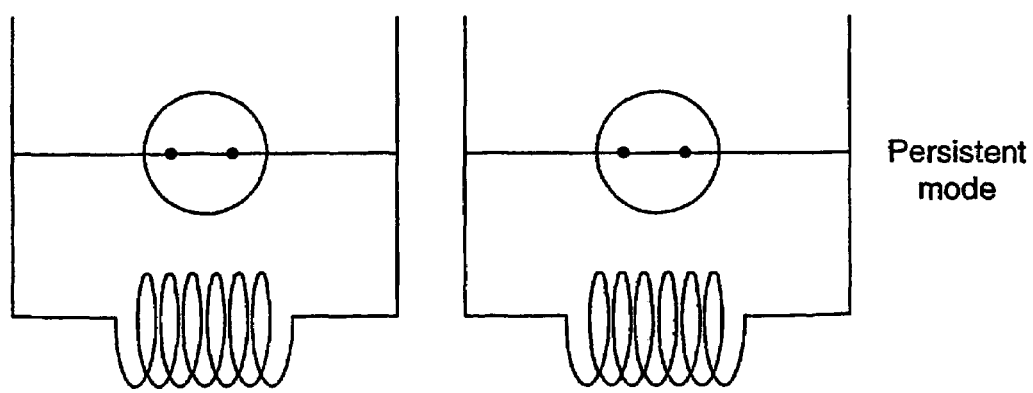

FIGS. 8-12 plot $B_2/B_1$ at $b_2$ against $a_2$ for systems which satisfy this condition, for various values of $a_1$, $\alpha_1$ and $\alpha_2$;

FIG. 13 is a view similar to FIG. 1 but for one of the systems illustrated in Table 1 below;

FIGS. 14-17 show the axial profiles for the systems referenced 1, 3, 5 and 6 respectively;

FIGS. 18 and 19 show the axial field profile for this system, and the difference between it and the non-gradient system; and, FIGS. 20A and 20B illustrate circuits including the main magnet and accessory coils during and after energisation respectively.

Figure 1:
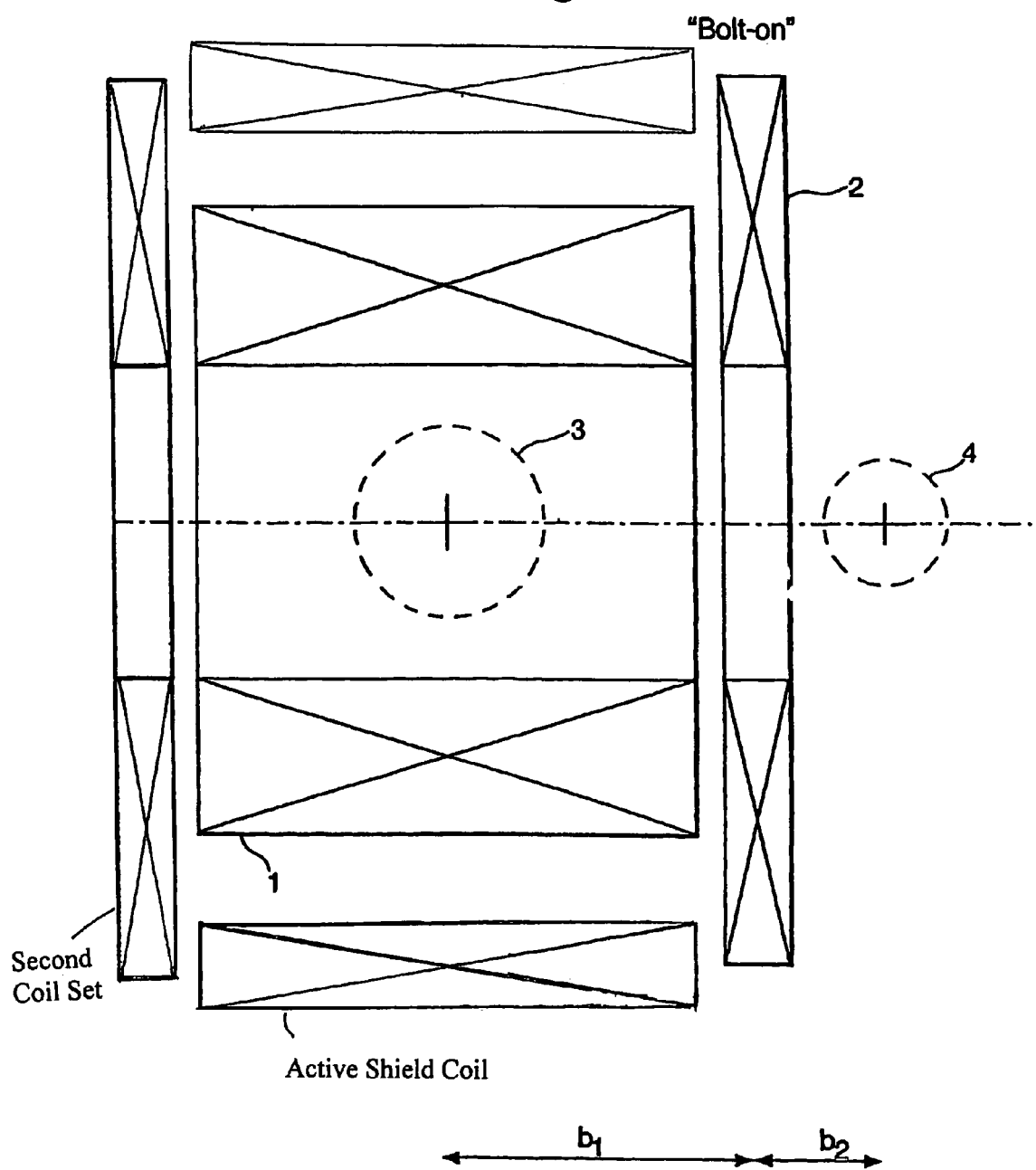
FIG. 1 is a schematic cross-section through an example of a magnet assembly.

FIG. 1 illustrates the general structure of a magnet assembly according to the invention. Thus, a main magnet 1, typically a solenoid, is located adjacent a set of nested accessory coils 2 which are coaxial with the magnet 1. As will be explained below, the magnet 1 and coils 2 can be activated in a variety of ways so as to generate (not necessarily simultaneously) a first homogeneous region 3 centred within the magnet 1 and a second homogeneous region 4 located externally of the envelope of the overall assembly.

The main magnet 1 and accessory coils 2 will be made from superconducting material. Both could be made from low temperature superconductor and they could be located within the same or respective cryostats (which are not shown in FIG. 1 for clarity). The accessory coils 2 could instead be made of high temperature superconductor and again could be located within the same or a different cryostat from that of the main magnet 1. The main magnet 1 and accessory coils 2 could be separable without compromising the integrity of the main magnet 1 which can be allowed to continue to operate, providing the two are self-contained. In general, however, the main magnet 1 and accessory coils 2 will be located together.

1 Inhomogeneous Magnet Central Field Region 3

The use of a set of accessory coils with two examples of conventional MRI magnets has been studied.

1. Unshielded 1.5 T magnet (axial length 1.75 m)
2. Self-shielded, short 1.0 T magnet (axial length 0.975 m)

The accessory windings 2 are assumed to occupy a space 100 mm thick and to be spaced 75 mm from the end of the magnet windings. The working or homogeneous volume 4 is assumed to be 250 mm from the accessory windings 2.

In both cases, an accessory coil was found which cancelled the $1^{st}$ and $2^{nd}$ order axial gradients at the working volume, producing plateau regions in the profile of the fringe field. Additional coils to cancel higher order gradients would be possible, and would not greatly affect the conclusions with respect to field strength and forces.

Unshielded 1.5 T Magnet

Figure 2:
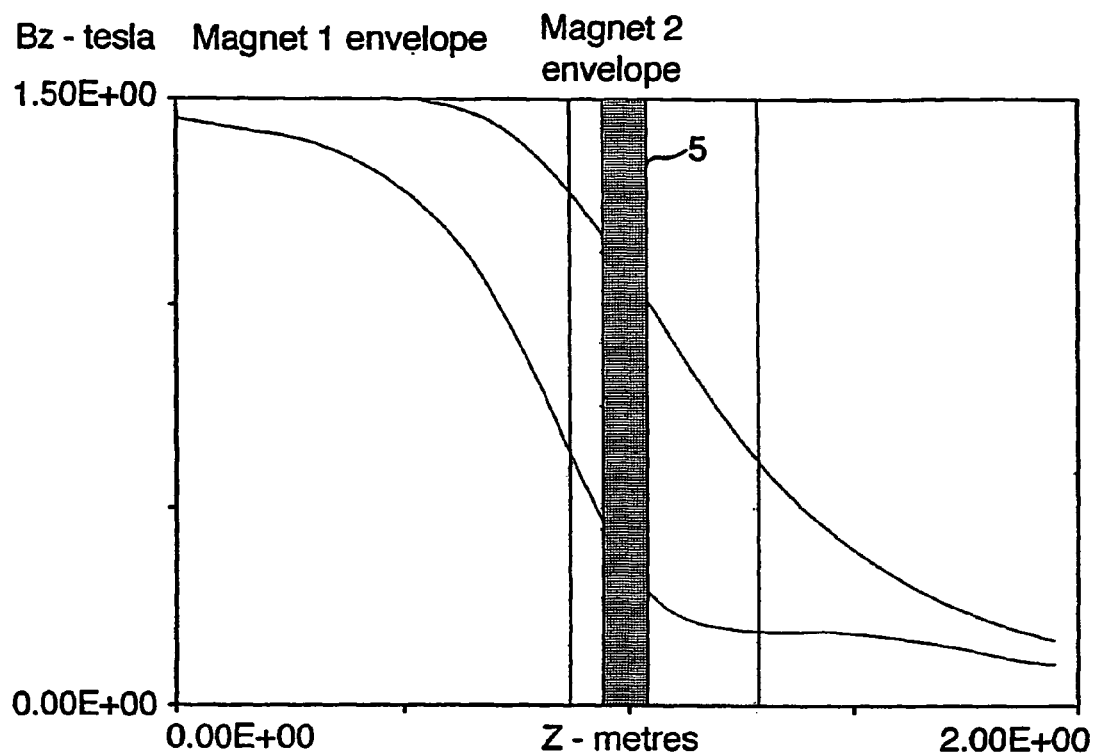
FIGS. 2 and 3 illustrate the axial field profile and field contour respectively for an unshielded based example.
Figure 3:
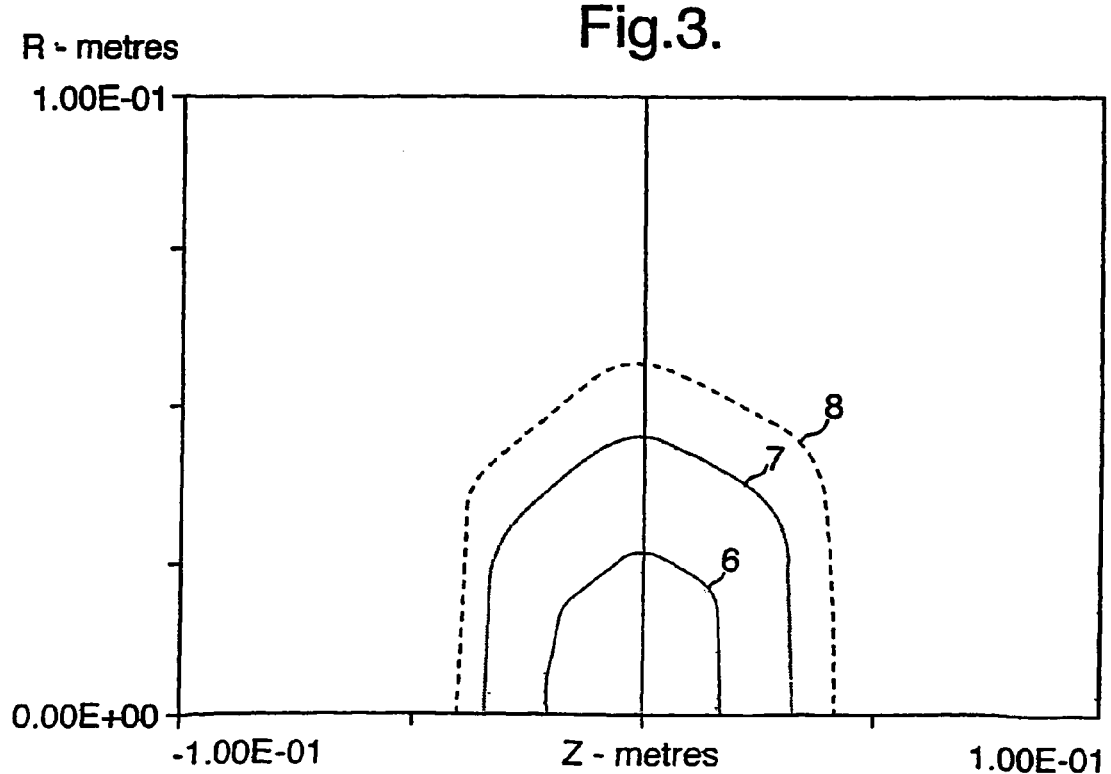

The axial field profile and field contour map are shown in FIGS. 2 and 3. In FIG. 2, the centre of the second homogeneous region 4 is shown at 5. Z=0 corresponds to the axial centre of the magnet 1. In FIG. 3, lines 6-8 indicate contours at 2.0E-04, 1.0E-04 and 2.0E-05 tesla respectively.

The field strength in the region 4 is 0.2 tesla (13% of the magnet's central field) and the axial force between the accessory coil 2 and the magnet 1 is 81.75 tonnes. The accessory coil 2 has 618600 Ampere-turns at a mean radius of 444 mm.

Self-shielded, Short 1.0 T Magnet

FIGS. 4 and 5 show equivalent plots to FIGS. 2 and 3. The field strength in the region 4 is 0.1 tesla (10% of the magnet's central field) and the axial force between the accessory coil 2 and the magnet 1 is 141.74 tonnes. The accessory coil 2 has 613760 Ampere-turns at a mean radius of 515 mm. In FIG. 5, lines 9-11 illustrate contours at 1.0E-04, 5.0E-05 and 1.0-05 tesla respectively.

2 Homogeneous Magnet Central Field Region 3

The above showed that it was possible to produce an "external field" region 4 beyond the end of conventional MRI magnets 1. The examples, which used a single coil 2, although producing an external homogeneous region 4, destroyed the field uniformity at the centre of the magnet 3. This means that the two regions 3,4 could not be used at the same time. Because of the coupling of the accessory set 2 with the main magnet 1, energisation of the accessory 2 requires that the main magnet 1 is also put on its power supply.

A further improvement is to have both regions 3,4 available simultaneously, so that the combined system would only need energising once.

This can be achieved by finding a system of accessory coils 2 which

1. Cancel the gradients at the end of the magnet 1 so as to produce an external homogeneous region 4, while
2. Not producing inhomogeneities at the centre of the magnet which cannot be corrected by a standard shim set as would be provided with a MRI system.

As an example, the unshielded 1.5 tesla magnet described previously is used. The target is to find a set of accessory coils 2, essentially co-planar and positioned 1 meter from the magnet centre which produces a field which has no first or second order gradients at the centre of the region 3, or at the external field volume 4, about 1.3 meters from the magnet centre. Higher order gradients should be sufficiently small to be manageable with shim-coils. The arrangement is illustrated in FIG. 1, with $b_1$=1.0 m and $b_2 \approx$0.3 m.

Figure 6:
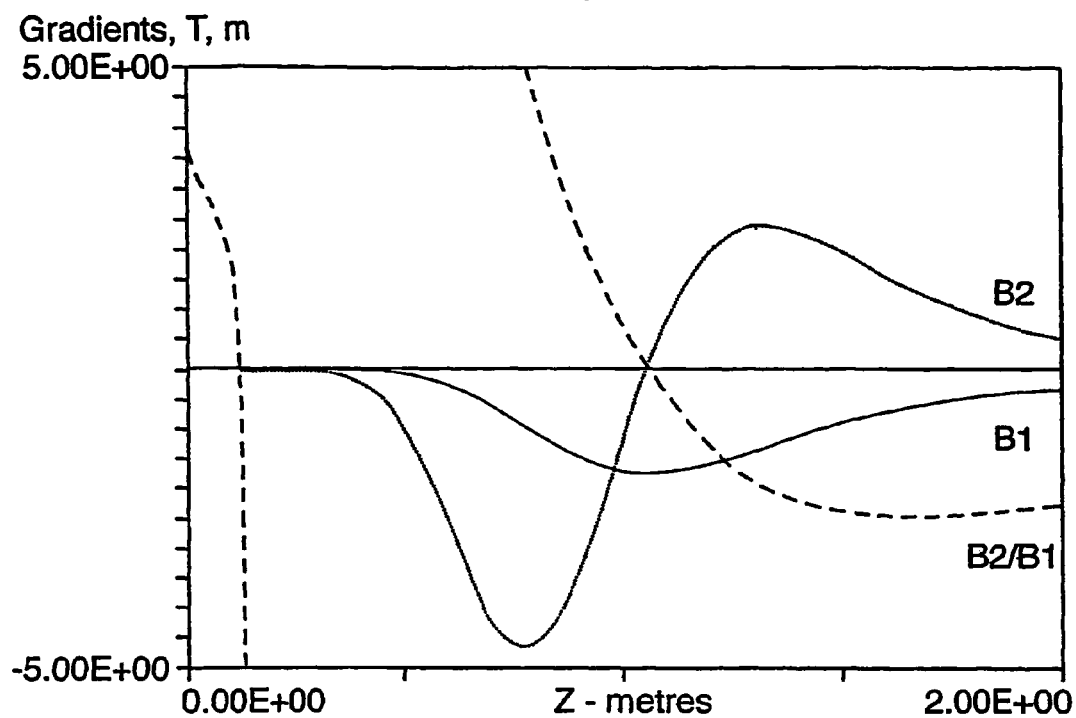
FIG. 6 illustrates the variation of B1 and B2 for a double homogeneous region system.

Thus we seek a system that produces no $1^{st}$ or $2^{nd}$ order gradients (B1,B2) at $b_1$ while producing a specified ratio of $2^{nd}$ to $1^{st}$ order gradients (B2/B1) at $b_2$. In this example, the ratio is about −1.8577 at $b_2$=0.3 m and its most negative value is −2.41 at $b_2$=1.65 m. See FIG. 6.

To achieve this, the accessory coils system 2 consists of four coils. These are grouped in two pairs. Each pair produces zero $1^{st}$ order gradient (B1) at $b_1$ and the second order gradients (B2) produced by the pairs are equal and opposite. The dimensions are then chosen to produce the correct ratio of $B_2/B_1$ at $b_2$ and the strengths adjusted to cancel the magnet gradients at this point.

To make the calculation (relatively) easy, the coils are represented as single turns, characterised by a radius, $a_1$, $a_2$, $a_3$, $a_4$ and a relative strength $n_1$, $n_2$, $n_3$, $n_4$. The single-turn coils can be replaced with coils of distributed current density whose effective centroids are at the positions occupied by the single-turn coils.

Coils 1 and 2 are members of one pair, and 3 and 4 are members of the other pair. We also use the ratios $a_1=a_2/a_1$ and $a_2=a_4/a_3$.

For a single turn, the gradients, in units of $A/m^{order+1}$, are given by Equations 1-4.

A pair of coils then produces no first order gradient at position b on the axis when Equation 5 is satisfied.

The total second order gradient of the pair is given by Equation 6.

Figure 7:
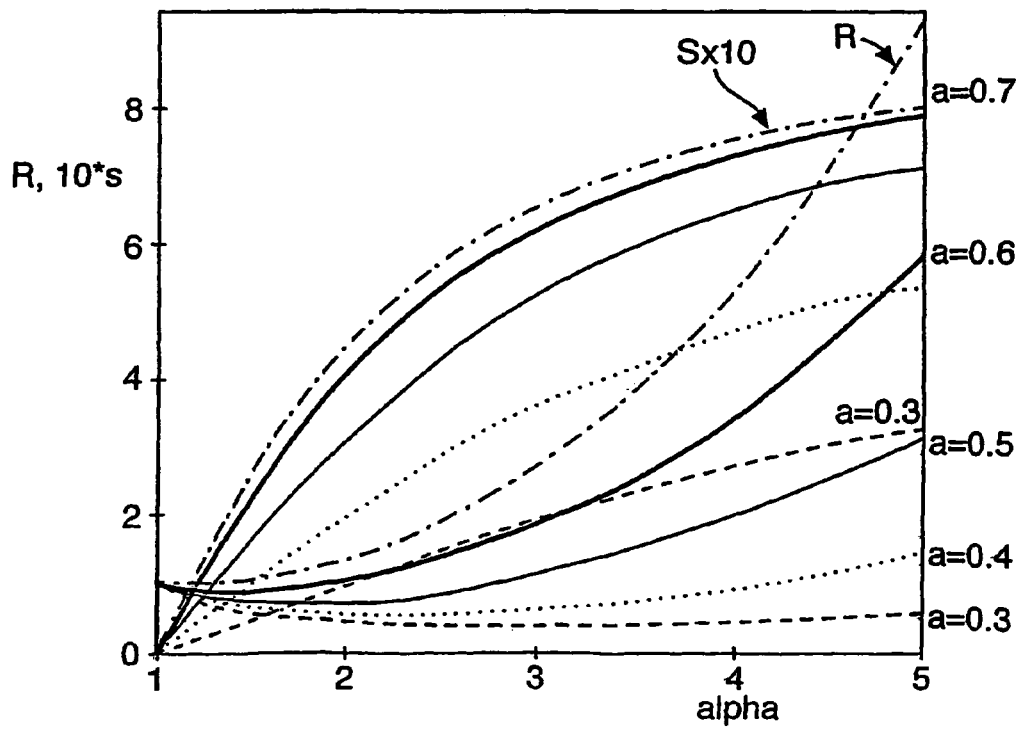
FIG. 7 is a plot of R and S.
Figure 8:
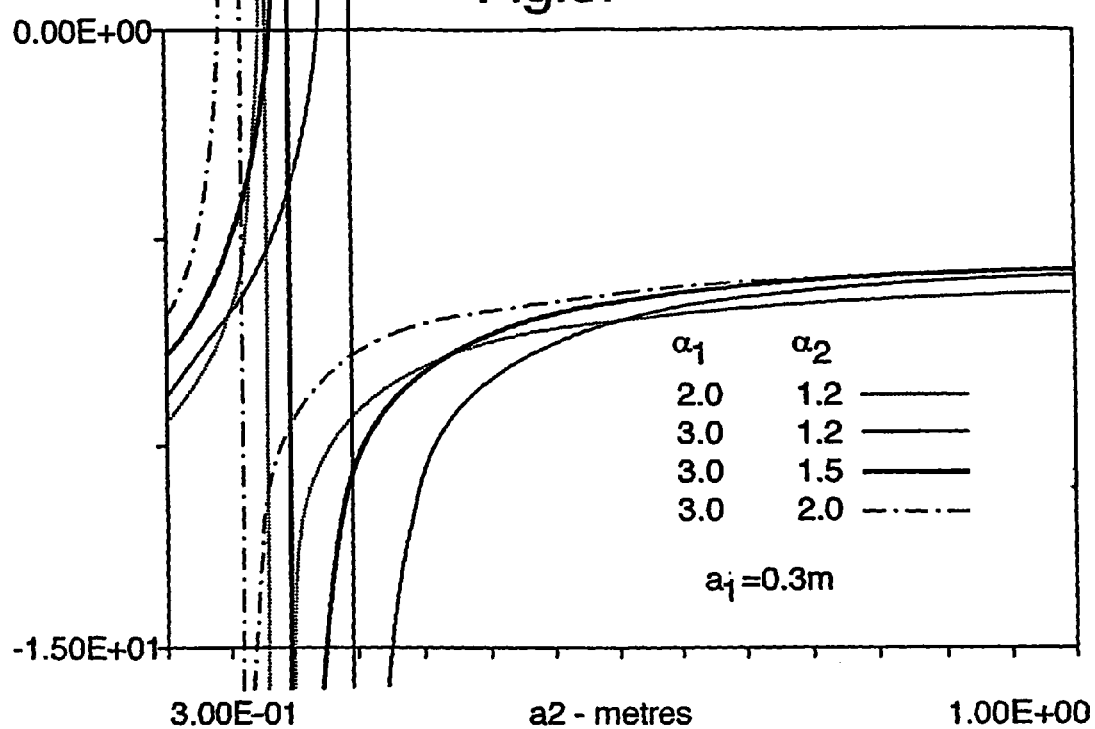
Figure 9:
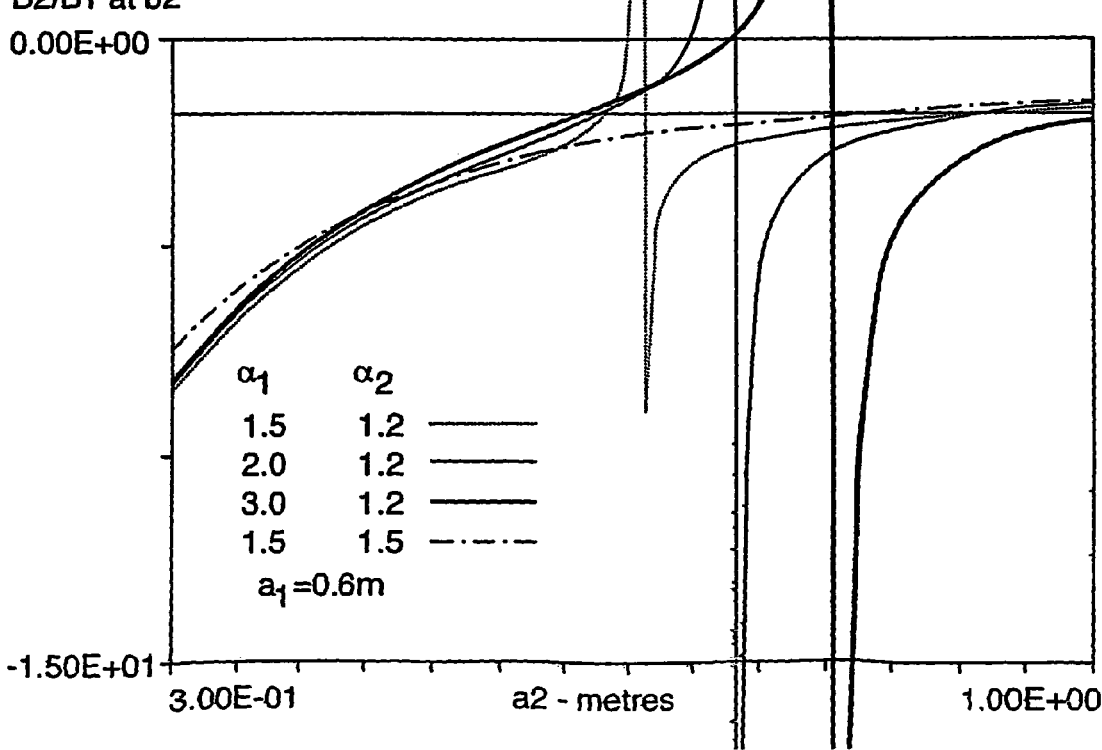
Figure 12:
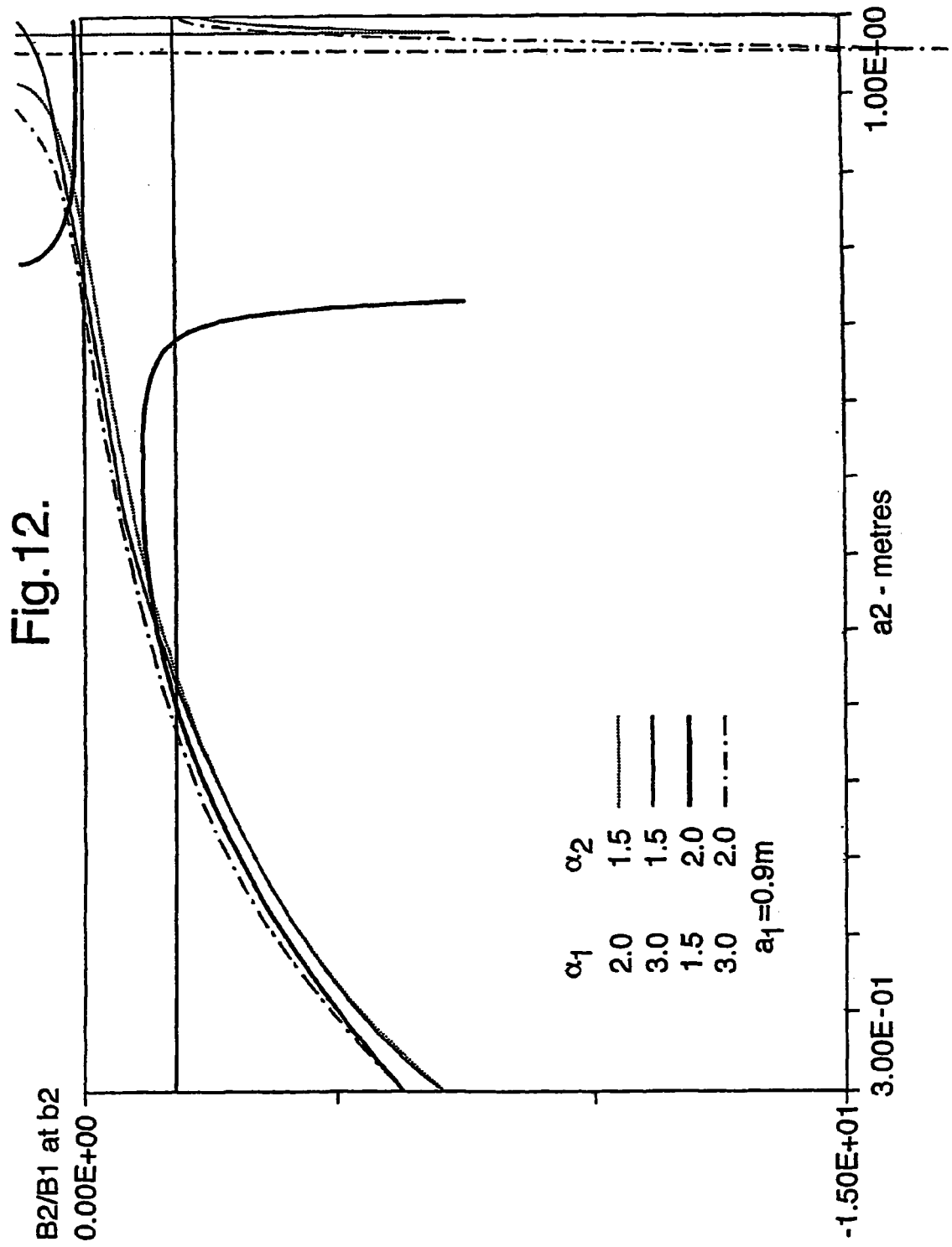

These functions are shown plotted against α and a for b=1 m in FIG. 7.

We can now see that it is possible to choose two pairs of coils with different values of α and choose their relative strengths so that the second order gradients cancel. There is an infinite number of pairs of pairs for which this is possible, so all we need to do is to find some which also have the correct ratio of $B_2/B_1$ at $b_2$. The condition for zero $B_1$ and zero $B_2$ at the magnet centre is given by Equation 7 where m is the strength of the second pair relative to the first.

FIGS. 8 to 12 plot $B_2/B_1$ at $b_2$ against $a_2$ for systems which satisfy this condition, for various values of $a_1$, $α_1$ and $α_2$.

It can be seen that for most of these curves, the required value of −1.8577 exists, although for the smaller values of $a_1$ and $a_2$ the steepness of the curves in this region implies a high accuracy of a is required.

Using this method, some examples have been calculated. Table 1 shows the radii (a) and relative strengths (n) for coils 1 to 4, and the field strengths in the two homogeneous regions 3,4 (original central field was 1.5 tesla). The last two columns show the radii of the homogeneous volumes, being the radius at which the third order gradients contribute 100 ppm i.e. volumes which are sufficiently homogeneous to enable an NMR process to be performed on an object in the region.

TABLE 1

| ref | | coil 1 | coil 2 | coil 3 | coil 4 | $B_0(b_1)$ Tesla | $B_0(b_2)$ Tesla | $r_0(b1)$ m | $r_0(b2)$ m |
|---|---|---|---|---|---|---|---|---|---|
| 1 | a (m) | 0.300 | 0.600 | 0.3719 | 0.4463 | 1.497 | 0.411 | 0.172 | 0.014 |
|   | n (Aturns × $10^6$) | 3.4150 | −1.4845 | −10.115 | 8.0018 | | | | |
| 2 | | 0.300 | 0.900 | 0.3763 | 0.5644 | 1.490 | 0.382 | 0.135 | 0.015 |
|   | | 1.2759 | −0.5038 | −2.8267 | 1.8011 | | | | |
| 3 | | 0.600 | 0.900 | 0.6317 | 0.7580 | 1.462 | 0.311 | 0.097 | 0.019 |
|   | | 7.7195 | −7.0107 | −17.145 | 16.000 | | | | |
| 4 | | 0.600 | 1.800 | 0.559 | 1.118 | 1.305 | 0.139 | 0.077 | 0.015 |
|   | | 1.3267 | −2.5299 | −2.2001 | 2.1163 | | | | |
| 5 | | 0.900 | 1.350 | 0.614 | 0.7368 | 1.424 | 0.267 | 0.088 | 0.018 |
|   | | 1.1151 | −1.5050 | −3.0703 | 2.8334 | | | | |
| 6 | | 0.900 | 2.700 | 0.532 | 1.064 | 1.126 | −0.040 | 0.072 | 0.010 |
|   | | 0.6110 | −3.0480 | −1.0293 | 0.916 | | | | |

FIG. 13 illustrates the arrangement of example 2 from the Table. FIGS. 14-17 show the axial profiles for the systems referenced 1, 3, 5 and 6 respectively.

The above analysis has described systems which produce an approximately spherical volume of field homogeneity. For the external field region 4, it can be advantageous to have a fixed first-order Z-gradient, to be used in slice selection. This avoids the use of Z-gradient coils which would obtrude on the access to the homogeneous region. In this the homogeneous volume is disk-shaped, with the radius of the disk determined by the third-order gradient.

The calculation proceeds as follows:

If the required Z-gradient at $b_2$ is $G_z$, then the system of coils is chosen to have the ratio of second to first order gradients of $B_2/(B_1-G_z)$. The strength is then chosen to give the required value of $G_z$. An example is set out in Table 2.

TABLE 2

| ref | | coil 1 | coil 2 | coil 3 | coil 4 | $B_0(b_1)$ Tesla | $B_0(b_2)$ Tesla | $r_0(b1)$ m | $r_0(b2)$ m | $G_z$ $Tm^{-1}$ |
|---|---|---|---|---|---|---|---|---|---|---|
| 2b | a (m) | 0.300 | 0.900 | 0.37613 | 0.56420 | 1.490 | 0.3856 | 0.135 | 0.015 | −0.019 |
|    | n (Aturns × $10^6$) | 1.2509 | −0.49387 | −2.7734 | 1.7669 | | | | | |

FIGS. 18 and 19 show the axial field profile for this system, and the difference between it and the non-gradient system.

FIG. 20 illustrates the circuits in which the magnet 1 and accessory coils 2 are located. As can be seen in FIG. 20A, each has its own power supply 20,21 respectively. In the case of the magnet 1, this is connected in parallel with a switch 22. During energisation, the two supplies 20,21 are switched on while the switch 22 is open. The switch 22 is then closed and the magnet 1 will continue to operate in persistent mode while power continues to be supplied from the power supply 21 to the coils 2 (FIG. 20B).

In practice, energising the accessory coils 2 would require either
- putting the main magnet 1 back on its power supply, or
- having a second accessory coil at the other end of the magnet so that the net coupling to the magnet was zero. (However, this would double the force problem—see below), or
- designing and setting-up a system such that the main magnet 1 and the accessory coils 2 could be used together, and so both could be left permanently energised.

It should be noted that the force between the accessory coils 2 and the magnet 1 is substantial. The force acting on the magnet's cryostat could be eliminated by a symmetrical arrangement of accessory coils at both ends.

EQUATIONS $$B_0(\alpha, b) = \frac{\mu_0 \alpha^2}{2(\alpha^2 + b^2)^{3/2}} \tag{1}$$

$$B_1(\alpha, b) = \frac{-3\mu_0 \alpha^2 b}{2(\alpha^2 + b^2)^{5/2}} \tag{2}$$

-continued $$B_2(\alpha, b) = \frac{15\mu_0 \alpha^2 b^2}{2(\alpha^2 + b^2)^{7/2}} - \frac{3\mu_0 \alpha^2}{2(\alpha^2 + b^2)^{5/2}} \tag{3}$$

$$B_3(\alpha, b) = \frac{-105\mu_0 \alpha^2 b^3}{2(\alpha^2 + b^2)^{9/2}} + \frac{45\mu_0 \alpha^2 b}{2(\alpha^2 + b^2)^{7/2}} \tag{4}$$

-continued $$\frac{n_1}{n_2} = -\frac{\alpha_1^2(\alpha_2^2+b^2)^{5/2}}{\alpha_2^2(\alpha_1^2+b^2)^{5/2}} = -\frac{1}{a^2}\frac{(\alpha^2+\beta^2)^{5/2}}{(1+\beta^2)^{5/2}} = R(\alpha\beta) \quad \text{Equation 5}$$

$$S(a,b,\alpha) = B_2(a,b) + R(\alpha b/a) \cdot B_2(\alpha a,b) \quad \text{Equation 6}$$

$$S(a_1,b_1,\alpha_1) = mS(a_3,b_1,\alpha_2) \quad \text{Equation 7}$$

The invention claimed is:

1. A magnet assembly comprising:
a first and a second set of coils to generate respective magnetic fields, wherein coils of the first and the second set are constructed and arranged such that under working conditions, a first homogeneous region can be generated within an envelope defined by the magnet assembly and a second homogeneous region can be generated outside the envelope, a resultant magnetic field in each of the first homogenous region and the second homogenous region being sufficiently homogeneous to enable a NMR process to be performed on an object in the respective first and second homogenous region.

2. An assembly according to claim 1, wherein the coils are operable to generate the first and second homogeneous regions simultaneously.

3. An assembly according to claim 1, wherein the first set of coils define a solenoid.

4. An assembly according to claim 1, wherein the first set of coils are actively shielded.

5. An assembly according to claim 2, wherein the second set of coils are nested.

6. An assembly according to claim 5, wherein the nested coils are substantially coplanar.

7. An assembly according to claim 5, wherein at least two of the coils of the second set are arranged to carry working currents in opposite senses.

8. An assembly according to claim 5, wherein the second set of coils comprises at least two pairs of coils.

9. An assembly according to claim 8, wherein in the first homogeneous region each pair of coils generates a substantially zero first order magnetic field gradient and substantially equal second order magnetic field gradients of opposite senses.

10. An assembly according to claim 1, wherein the first set of coils is superconductive.

11. An assembly according to claim 10, wherein the second set of coils is superconductive.

12. An assembly according to claim 11, wherein the second set of coils are made from high temperature superconductor.

13. An assembly according to claim 11, wherein the second set of coils are located within a cryostat.

14. An assembly according to claim 13, wherein the first and second sets of coils are located within a same cryostat.

15. An assembly according to claim 1, wherein the second set of coils are self-contained so that the second set of coil can be separated from the first set of coils without compromising an operational integrity of the first set of coils.

16. An assembly according to claim 1, wherein the second homogeneous region is substantially spherical.

17. An assembly according to claim 1, wherein the second homogeneous region is substantially disk shaped and has a magnetic field gradient in an axial direction.

18. An assembly according to claim 1, wherein the first homogeneous region is located within the first set of coils.

19. An assembly according to claim 1, wherein a magnetic field strength in each of the first homogenous region and the second homogeneous region varies by no more than 100 ppm.

20. An assembly according to claim 1, further comprising a power supply coupled to the first and second sets of coils so as continuously to energise the first and second sets of coils.

21. An assembly according to claim 1, further comprising an additional set of second coils located adjacent to the first set of coils and opposite to the second set of coils relative to the first set of coils.

* * * * *